(12) United States Patent
Haga

(10) Patent No.: US 11,619,680 B2
(45) Date of Patent: Apr. 4, 2023

(54) BATTERY DETERIORATION JUDGING SYSTEM, BATTERY DETERIORATION JUDGING METHOD, AND NON-TRANSITORY STORAGE MEDIUM THAT STORES A BATTERY DETERIORATION JUDGING PROGRAM

(71) Applicant: TOYOTA JIDOSHA KABUSHIKI KAISHA, Toyota (JP)

(72) Inventor: Nobuyasu Haga, Seto (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/719,887

(22) Filed: Apr. 13, 2022

(65) Prior Publication Data
US 2022/0236337 A1    Jul. 28, 2022

Related U.S. Application Data

(63) Continuation of application No. 17/132,777, filed on Dec. 23, 2020, now Pat. No. 11,340,307.

(30) Foreign Application Priority Data
Feb. 6, 2020   (JP) .............................. JP2020-018736

(51) Int. Cl.
  *G01R 31/392*   (2019.01)
  *G01R 31/367*   (2019.01)
(52) U.S. Cl.
  CPC ......... *G01R 31/392* (2019.01); *G01R 31/367* (2019.01)

(58) Field of Classification Search
  CPC ............................ G01R 31/392; G01R 31/367
  See application file for complete search history.

(56) References Cited

U.S. PATENT DOCUMENTS

| 2010/0030498 | A1* | 2/2010 | Kimura | ................... | H02J 7/005 |
| | | | | | 307/66 |
| 2016/0356856 | A1* | 12/2016 | Hongo | ................. | G01R 31/392 |
| 2017/0263984 | A1* | 9/2017 | Fujita | .................. | H01M 10/482 |

(Continued)

FOREIGN PATENT DOCUMENTS

| EP | 3611524 A1 | 2/2020 |
| JP | 2018-179733 A | 11/2018 |

OTHER PUBLICATIONS

Oct. 6, 2021 Office Action issued in U.S. Appl. No. 17/132,777.
Feb. 1, 2022 Notice of Allowance issued in U.S. Appl. No. 17/132,777.

*Primary Examiner* — Raymond L Nimox
(74) *Attorney, Agent, or Firm* — Oliff PLC

(57) ABSTRACT

A battery deterioration judging system includes a memory, and a processor coupled to the memory. The processor is configured to acquire a state amount of a battery, derive a first deterioration probability of the battery, based on the state amount of the battery and a predetermined first calculation model, derive a reliability degree of a second calculation model, which is different than the first calculation model, based on a number of state amounts, derive a second deterioration probability of the battery, based on the state amount of the battery and the second calculation model, and judge deterioration of the battery based on the reliability degree, and at least one of the first deterioration probability or the second deterioration probability.

19 Claims, 13 Drawing Sheets

(56) References Cited

U.S. PATENT DOCUMENTS

| | | | | |
|---|---|---|---|---|
| 2017/0294689 A1* | 10/2017 | Wada | ............... | H01M 10/486 |
| 2018/0261893 A1* | 9/2018 | Fujita | ............... | H02J 7/04 |
| 2020/0247268 A1* | 8/2020 | Aoyama | ............... | B60L 58/13 |
| 2021/0190877 A1* | 6/2021 | Isa | ............... | G01R 31/374 |

* cited by examiner

FIG.4
(1) RULE MODEL
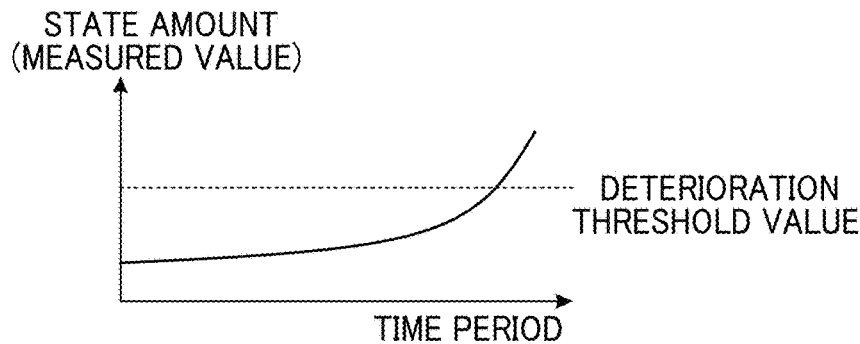
(2) BATTERY LOAD INTEGRATION MODEL
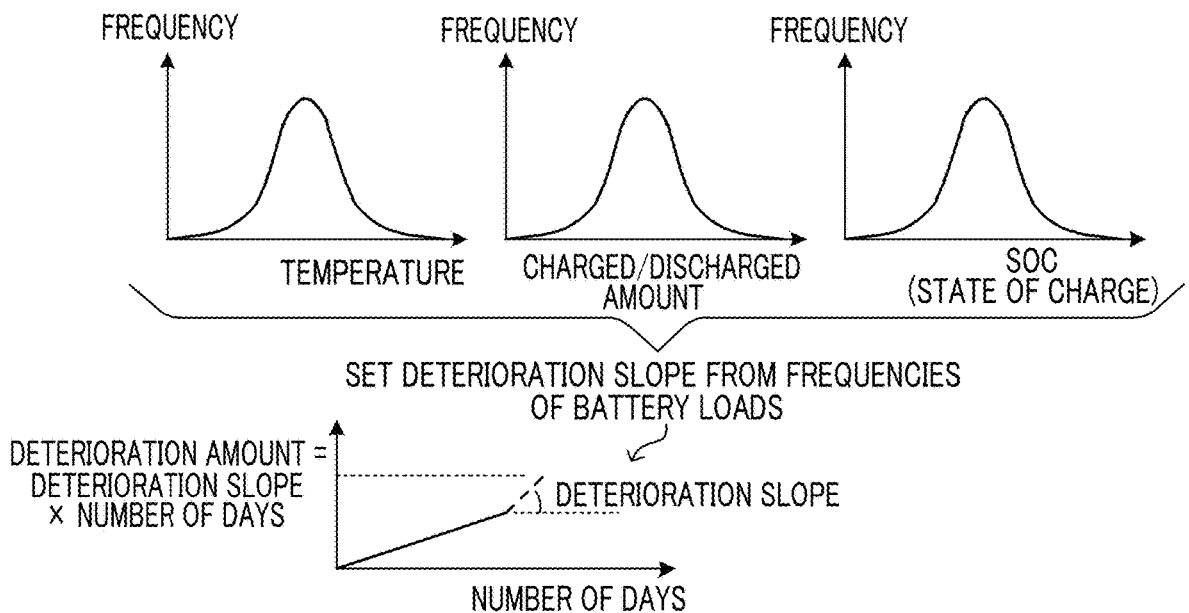
(3) DETERIORATION MECHANISM MODEL
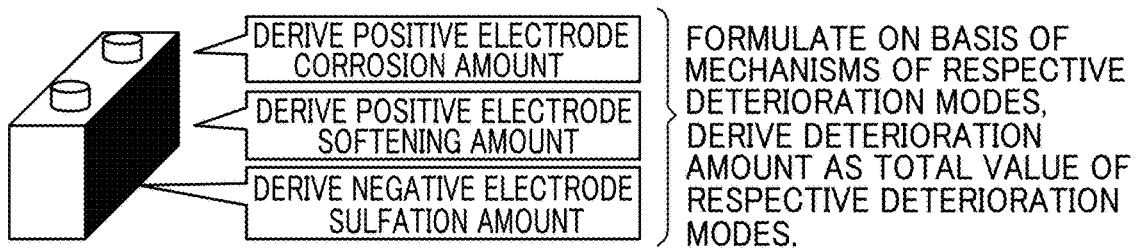

BATTERY DETERIORATION JUDGING SYSTEM, BATTERY DETERIORATION JUDGING METHOD, AND NON-TRANSITORY STORAGE MEDIUM THAT STORES A BATTERY DETERIORATION JUDGING PROGRAM

CROSS-REFERENCE TO RELATED APPLICATION

This application is a continuation of U.S. application Ser. No. 17/132,777 filed Dec. 23, 2020, which is based on and claims priority under 35 USC 119 from Japanese Patent Application No. 2020-018736 filed on Feb. 6, 2020, the entire disclosures of the prior applications being incorporated herein by reference.

BACKGROUND

Technical Field

The present disclosure relates to a battery deterioration judging system, a battery deterioration judging method, and a non-transitory storage medium on which is stored a battery deterioration judging program, which judge the deterioration of a battery such a battery for auxiliary equipment of a vehicle or the like.

Related Art

Japanese Patent Application Laid-Open (JP-A) No. 2018-179733 proposes a lifespan diagnosis device for a battery that has: a storage section that stores a usage time period of the battery, which is measured at each time, and a measured value of a deterioration index that expresses the deterioration of the battery and that is measured at each time, and a processing section that diagnoses the lifespan of the battery. The processing section determines a time period change amount of the deterioration index based on the usage time period of the battery and the measured value of the deterioration index, and, based on the time period change amount of the deterioration index, determines a function for predicting the deterioration index for each individual battery. Based on the function for predicting the deterioration index, the processing section determines a predicted value of the deterioration index, and, based on the predicted value of the deterioration index, diagnoses the lifespan of the battery.

However, in the technique disclosed in JP-A No. 2018-179733, there is room for improvement because, up until information of the internal resistance, which serves as the measured value of the deterioration index, is accumulated, judgment on the deterioration of the battery cannot be carried out, or, even if judgment can be carried out, the accuracy of the judgement is low.

SUMMARY

The present disclosure provides a battery deterioration judging system, a battery deterioration judging method, and a non-transitory storage medium on which is stored a battery deterioration judging program that can judge deterioration of a battery with high accuracy even in cases in which a sufficient amount of data has not been collected.

A battery deterioration judging system of a first aspect includes an acquiring section that acquires a state amount of a battery, a first deriving section that derives a first deterioration probability of the battery, based on the state amount of the battery acquired by the acquiring section and a predetermined first calculation model, a reliability degree deriving section that derives a reliability degree of a second calculation model, which is different than the first calculation model, based on a number of state amounts acquired by the acquiring section, a second deriving section that derives a second deterioration probability of the battery, based on the state amount of the battery acquired by the acquiring section and the second calculation model, and a judging section that judges deterioration of the battery based on the reliability degree, and at least one of the first deterioration probability or the second deterioration probability.

In accordance with the first aspect, a state amount of the battery is acquired by the acquiring section. The acquired state amount is a physical amount that changes as the battery deteriorates, and examples thereof are the voltage, the resistance, the temperature and the like of the battery.

At the first deriving section, the first deterioration probability of the battery is derived based on the state amount of the battery acquired by the acquiring section and a predetermined first calculation model.

At the reliability degree deriving section, the reliability degree of a second calculation model, which is different than the first calculation model, is derived based on the number of state amounts acquired by the acquiring section.

At the second deriving section, the second deterioration probability of the battery is derived based on the state amount of the battery acquired by the acquiring section and the second calculation model.

Further, at the judging section, the deterioration of the battery is judged based on the reliability degree and at least one of the first deterioration probability or the second deterioration probability. Namely, the deterioration probability of the battery is derived by using plural calculation models and by taking the reliability degree of the second calculation model into consideration. Therefore, deterioration of the battery can be judged with higher accuracy than in a case in which the deterioration probability is computed by using a single calculation model. Further, because the deterioration is judged based on the reliability degree of the second calculation model, the deterioration of the battery can be judged with high accuracy even in a case in which there is a small number of state amounts.

Note that, as in a second aspect, the first deriving section may derive the first deterioration probability by using plural types of the first calculation model. Due thereto, the accuracy of the first deterioration probability can be improved more so than in a case using a single first calculation model.

Further, as in a third aspect, in a case in which a number of state amounts is greater than or equal to a predetermined upper limit value, the reliability degree deriving section may set the reliability degree of the second calculation model to 1, in a case in which the number of state amounts is less than or equal to a predetermined lower limit value, the reliability degree deriving section may set the reliability degree of the second calculation model to 0, in a case in which the number of state amounts is between the upper limit value and the lower limit value, the reliability degree deriving section may set the reliability degree of the second calculation model to a value that is between 0 and 1 and is determined in advance in accordance with the number of state amounts.

In this case, as in a fourth aspect, in a case in which the reliability degree is 1, the judging section may judge deterioration of the battery based on the second deterioration probability. Further, as in a fifth aspect, in a case in which the reliability degree is 0, the judging section may judge deterioration of the battery based on the first deterioration probability. Moreover, as in a sixth aspect, in a case in which the reliability degree is a value between 0 and 1, the judging section may judge deterioration of the battery based on the first deterioration probability and the second deterioration probability.

Further, as in a seventh aspect, the acquiring section may acquire the state amount that is detected by a sensor that is installed at a vehicle.

Note that, as in an eighth aspect, the present invention may be a battery deterioration judging method that causes a computer to execute processing that: acquires a state amount of a battery, derives a first deterioration probability of the battery, based on the acquired state amount and a predetermined first calculation model, derives a reliability degree of a second calculation model, which is different than the first calculation model, based on a number of state amounts, derives a second deterioration probability of the battery, based on the state amount of the battery and the second calculation model, and judges deterioration of the battery based on the reliability degree, and at least one of the first deterioration probability or the second deterioration probability.

Or, as in a ninth aspect, the present invention may be a non-transitory storage medium that stores a battery deterioration judging program for causing a computer to execute processing that: acquires a state amount of a battery, derives a first deterioration probability of the battery, based on the acquired state amount and a predetermined first calculation model, derives a reliability degree of a second calculation model, which is different than the first calculation model, based on a number of state amounts, derives a second deterioration probability of the battery, based on the state amount and the second calculation model, and judges deterioration of the battery based on the reliability degree, and at least one of the first deterioration probability or the second deterioration probability.

As described above, in accordance with the present disclosure, there can be provided a battery deterioration judging system, a battery deterioration judging method, and a non-transitory storage medium on which is stored a battery deterioration judging program, which can judge deterioration of a battery highly accurately even in cases in which a sufficient amount of data has not been collected.

BRIEF DESCRIPTION OF THE DRAWINGS

Exemplary embodiments of the present invention will be described in detail based on the following figures, wherein:

FIG. 4 is a drawing for explaining a method of computing deterioration probability by using a physical model;

DETAILED DESCRIPTION

Figure 1:
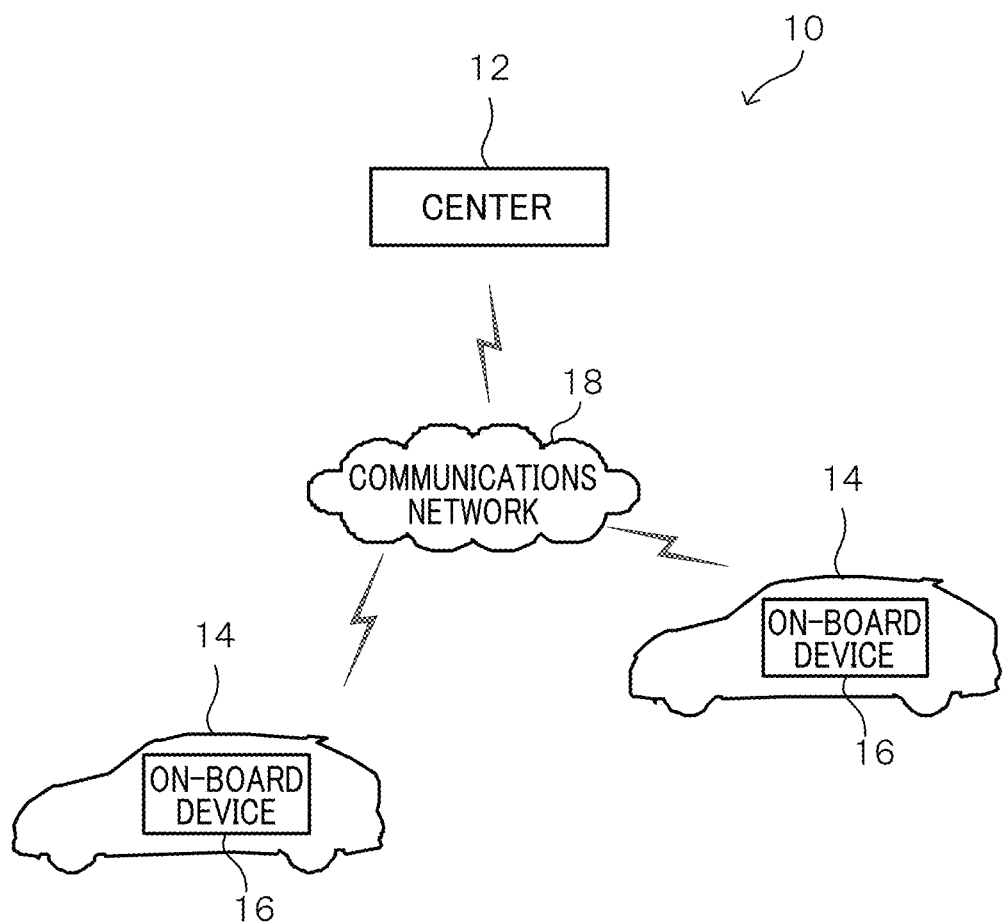
FIG. 1 is a drawing showing the schematic structure of a battery deterioration judging system relating to a present embodiment.

An example of an embodiment of the present disclosure is described in detail hereinafter with reference to the drawings. FIG. 1 is a drawing showing the schematic structure of a battery deterioration judging system relating to the present embodiment.

In a battery deterioration judging system 10 relating to the present embodiment, on-board device 16 that are installed in vehicles 14, and a center 12 are connected via a communications network 18. In the battery deterioration judging system 10 relating to the present embodiment, state amounts of batteries that are installed in the plural on-board device 16 are transmitted to the center 12, and the center 12 carries out battery deterioration judgement.

Techniques that use a physical model that is based on a deterioration mechanism for example are known as techniques for judging deterioration of a battery. However, in contrast with techniques that use big data and an AI model, in deterioration judgement that uses a physical model, the calculation formula that is based on the mechanism bears the burden of the robustness, and therefore, accuracy can be ensured with a small amount of deterioration data. On the other hand, it is often the case that the physical model itself is structured by a non-linear formula, and a large number of fitting steps are needed. Further, because fitting is carried out with only a small amount of deterioration data, it is difficult to take into consideration the dispersion in deterioration that occurs easily in the latter stages of deterioration in particular.

Thus, in the present embodiment, the center 12 carries out battery deterioration judgement that uses an AI model and battery deterioration judgment that uses a physical model. Namely, in the initial stage in which there is little training data, the center 12 judges the deterioration of the battery by using a physical model that is determined in advance and that serves as a first calculation model. Further, the center 12 utilizes machine learning that is based on AI (Artificial Intelligence) and big data of the state amounts of batteries that are collected from plural vehicles, and judges battery deterioration by using the state amounts of batteries as input values. In detail, in the initial stage in which there is a small number of data, the center 12 carries out battery deterioration judgment by using a physical model, and, as the number of data becomes larger, the center 12 transitions to battery deterioration judgement that uses an AI model that serves as a second calculation model.

Note that the present embodiment describes a case in which a lead storage battery for auxiliary equipment of the vehicle 14 is used as the battery. Further, the state amount is a state amount that expresses the state of the battery, in particular, is a physical amount that changes as the battery deteriorates. Examples include the voltage, the resistance, the temperature, and the like of the battery. In the present embodiment, description is given of an example in which the voltage of the battery is used as the state amount as an example.

Figure 2:
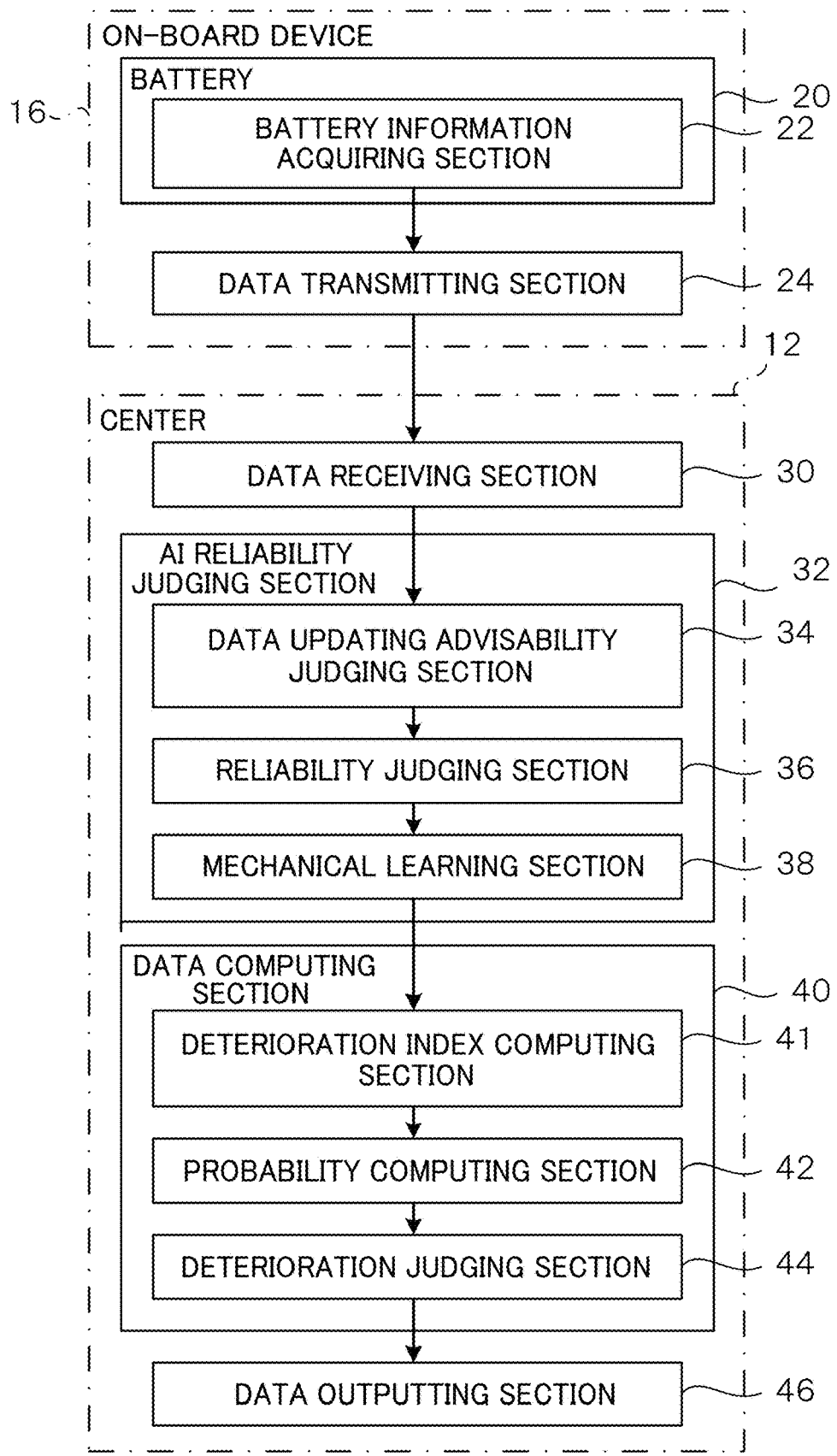
FIG. 2 is a block drawing showing functional structures of on-board device and a center in the battery deterioration judging system relating to the present embodiment.

FIG. 2 is a block drawing showing the structures of the on-board device 16 and the center 12 in the battery deterioration judging system 10 relating to the present embodiment. Further, FIG. 13 is a block drawing showing the hardware structures of the battery deterioration judging system 10 relating to the present embodiment.

Figure 13:
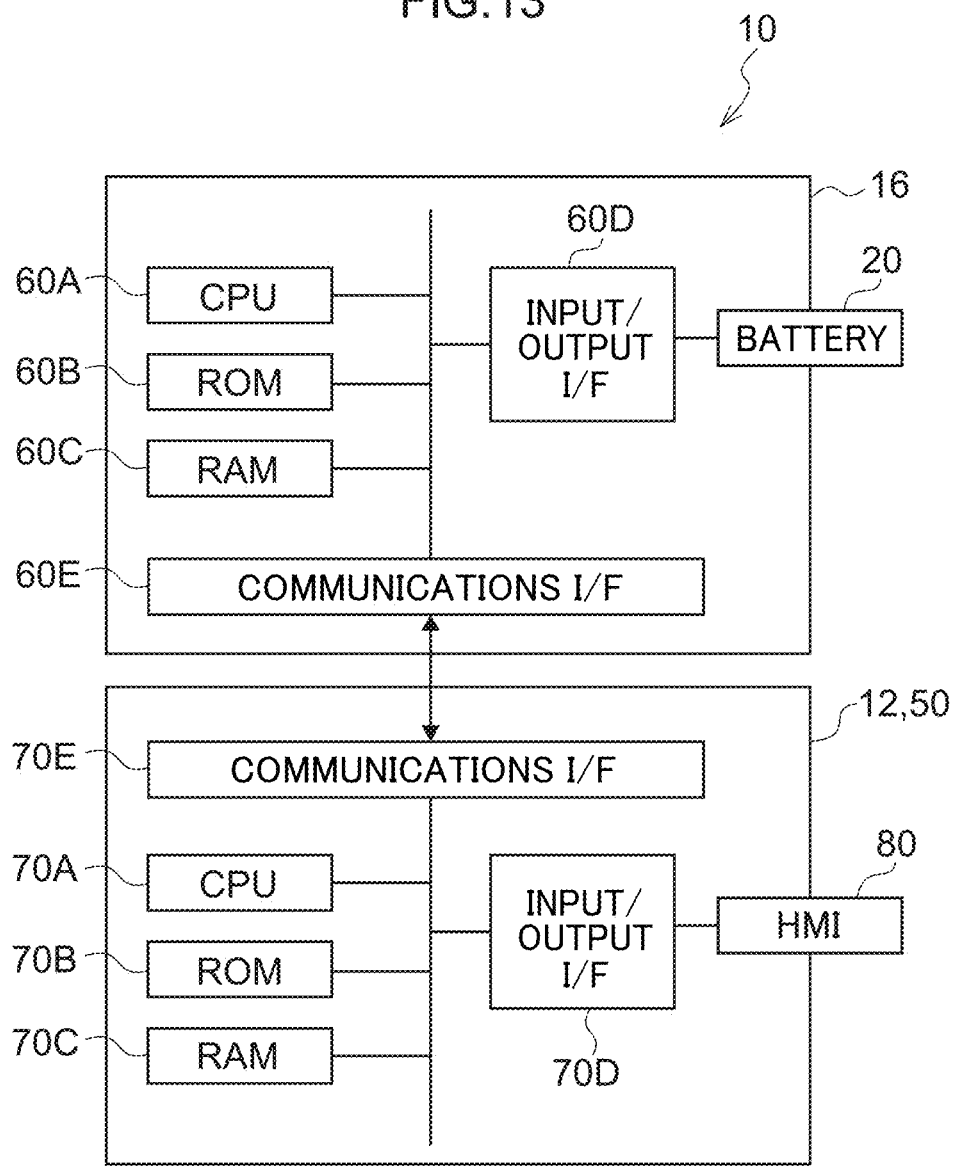
FIG. 13 is a block drawing showing hardware structures of the deterioration judging system relating to the present embodiment.

As shown in FIG. 13, the on-board device 16 is structured by a microcomputer that includes a CPU (Central Processing Unit) 60A that serves as a processor, a ROM (Read Only Memory) 60B that serves as a memory, a RAM (Random Access Memory) 60C, an input/output I/F 60D, a communications I/F 60E and the like. The CPU 60A functions as a battery information acquiring section 22 and a data transmitting section 24.

As shown in FIG. 2, the battery information acquiring section 22 acquires, as battery information, the voltage of a battery 20 that serves as the state amount of the battery 20 that is installed in the vehicle 14. The battery information acquiring section 22 acquires the voltage of the battery 20 by a voltage sensor for example. Further, the battery information acquiring section 22 may further have a temperature sensor that detects the temperature of the battery 20, and may also acquire the temperature of the battery 20.

The data transmitting section 24 transmits the battery information, which is acquired by the battery information acquiring section 22, to the center 12 via the communications network 18.

On the other hand, as shown in FIG. 13, the center 12 is structured by a computer that includes a CPU 70A that serves as a processor, a ROM 70B that serves as a memory, a RAM 70C, an input/output I/F 70D, a communications I/F 70E and the like. The input/output I/F 70D may be connected to an HMI (Human Machine Interface) such as a monitor 80 that has a touch panel, or the like. The CPU 70A functions as a data receiving section 30, an AI reliability judging section 32, a data computing section 40 and a data outputting section 46.

As shown in FIG. 2, due to the data receiving section 30 receiving battery information that is transmitted via the communications network 18 from the data transmitting section 24 of the on-board device 16, the data receiving section 30 acquires, from the on-board device 16 of the vehicle 14, battery information that expresses the state amount of the battery 20. Note that, in the following description, there are cases in which the battery information is described as the state amount of the battery 20.

The AI reliability judging section 32 has the functions of a data updating advisability judging section 34, a reliability judging section 36, and a mechanical learning section 38.

The data updating advisability judging section 34 carries out processing that judges whether or not updating of data is possible, by extracting data that has the possibility of having deteriorated, from among data that is the state amounts of the batteries 20 collected from the on-board device 16 of all of the vehicles 14 that the center 12 manages.

In a case in which the data updating advisability judging section 34 judges that data updating is possible, the reliability judging section 36 carries out processing for judging the reliability of mechanical learning by the AI model, which serves as processing for deriving the reliability degree of the second computational model.

Figure 3:
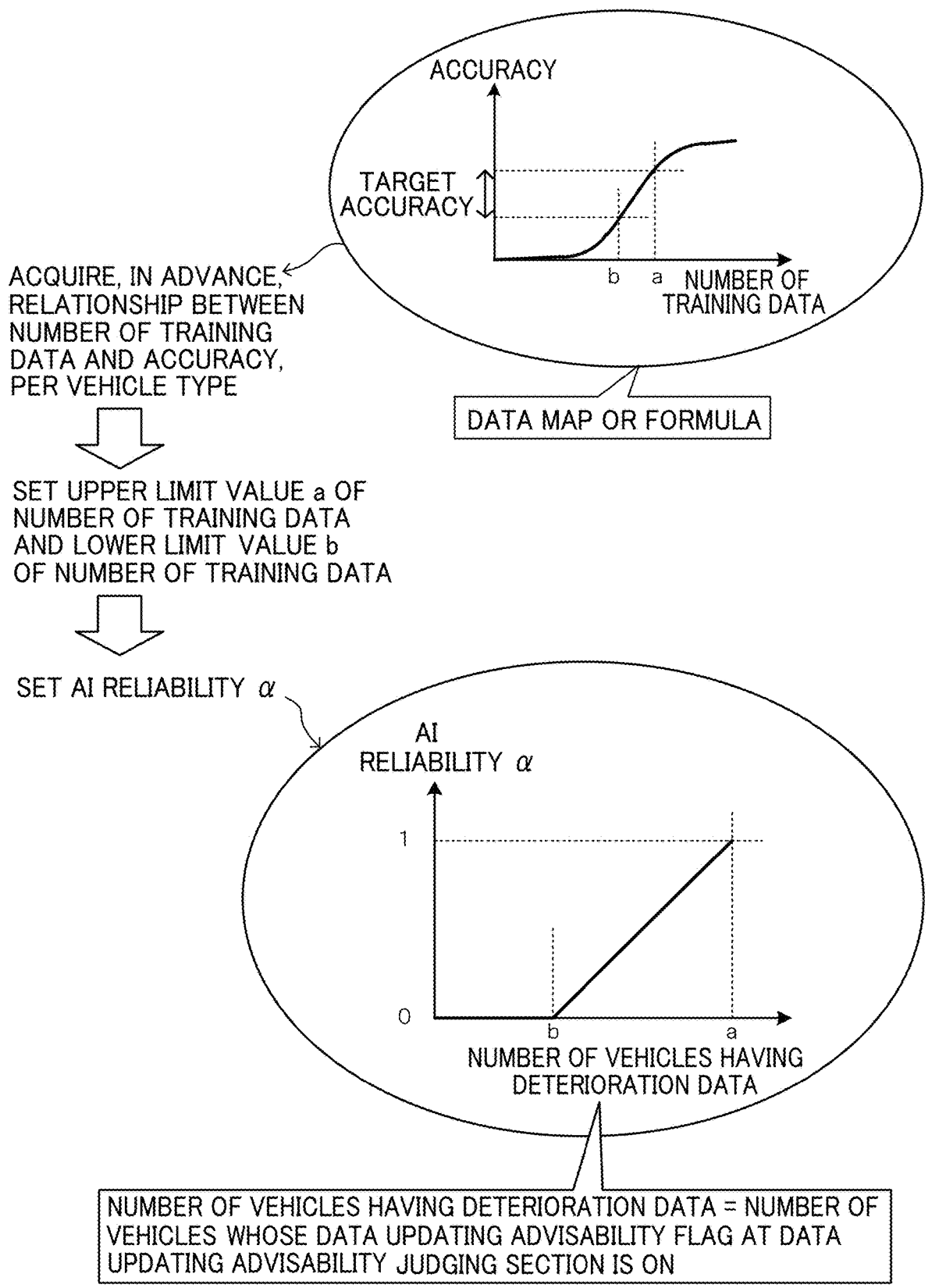
FIG. 3 is a drawing for explaining a method of computing AI reliability α.

The reliability α (AI reliability α) of mechanical learning by the AI model is derived based on the number of deterioration data which are training data. For example, as shown in FIG. 3, the relationship (a data map or a formula) between the number of training data and the accuracy per vehicle type is acquired in advance, and an upper limit value a and a lower limit value b of the number of training data that is the target accuracy are set. Then, the AI reliability α that corresponds to the number of training data is set. The example of FIG. 3 shows an example in which the reliability is set to 0 up to the point where the number of vehicles, which have deterioration data that have been judged to be deteriorated, reaches the lower limit value b of the number of training data, and, from the lower limit value b to the upper limit value a, the AI reliability is set so as to linearly approach 1, and, from the upper limit value a and thereafter, the AI reliability is set to 1. Note that the relationship of the AI reliability α to the number of vehicles having deterioration data that serve as training data is not limited to the example shown in FIG. 3, and it suffices for this to be a relationship that increases together with the increase in the number of vehicles that have deterioration data.

The mechanical learning section 38 carries out processing that updates the training data and carries out mechanical learning, in a case in which the reliability of mechanical learning by the AI model is in a predetermined range (the AI reliability α).

The data computing section 40 has the functions of a deterioration index computing section 41, a probability computing section 42, and a deterioration judging section 44, and carries out deterioration judgment on the battery 20 based on the state amount of the battery acquired from the on-board device 16.

By using a predetermined physical model, the deterioration index computing section 41 computes a deterioration probability that serves as the first deterioration probability of the battery 20. Concretely, the deterioration index computing section 41 computes the deterioration probability by using at least one physical model among the rule model, the battery load integration model, and the deterioration mechanism model that are shown in FIG. 4. In a case of using plural types of physical models, the deterioration probability that is the highest probability may be used as the deterioration probability that is computed by the physical models. Or, the deterioration probability that is the lowest probability may be used as the deterioration probability that is computed by the physical models. Or, the average value may be used as the deterioration probability that is computed by the physical models.

Note that, as shown in FIG. 4, the rule model is a physical model that that judges there to be deterioration when the state amount (e.g., the voltage or the resistance or the like) of the battery 20 is greater than or equal to a predetermined deterioration threshold value. Deterioration probabilities that correspond to the magnitudes of the state amount are determined in advance, and the deterioration probability is computed from the acquired state amount. Note that the deterioration threshold value is set from the temperature at that time, the current balance, the parked time, or the like.

Figure 5:
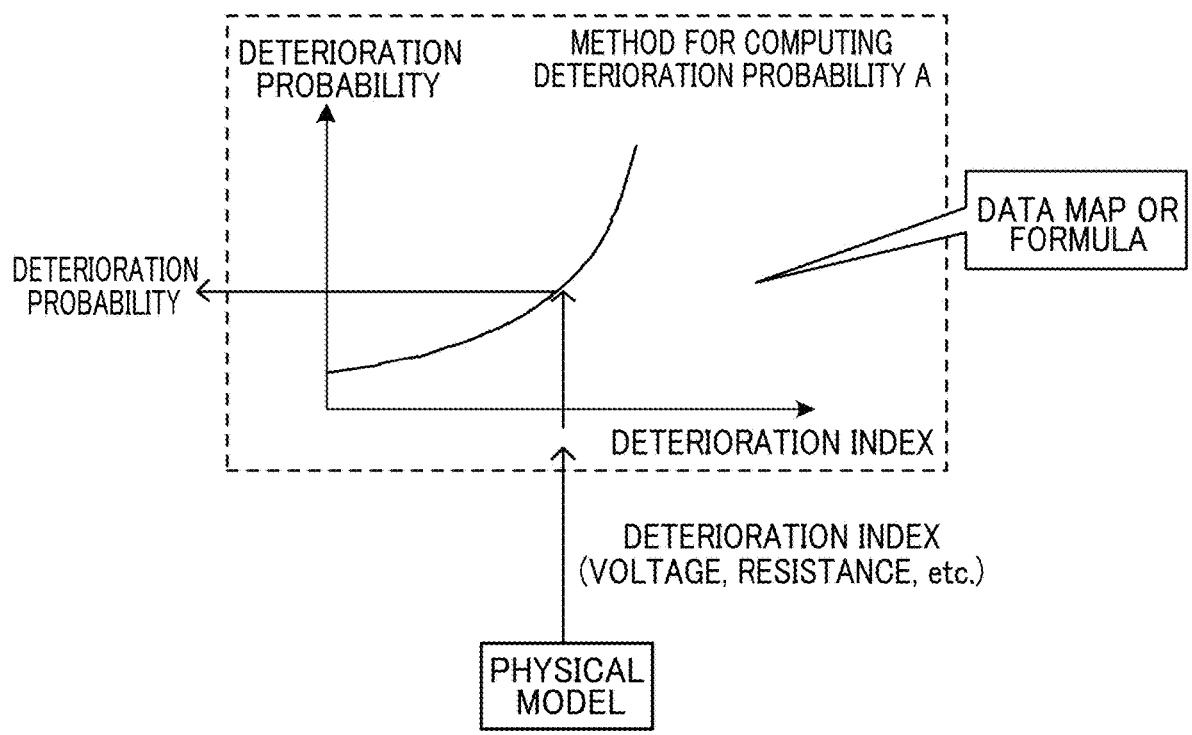
FIG. 5 is a drawing showing an example of computing the deterioration probability from a deterioration index.

Further, the battery load integration model computes the deterioration amount as the deterioration index from the frequency of the load of the battery 20, and computes the deterioration probability by using the computed deterioration index. For example, as shown in FIG. 4, a load such as the temperature, the charged/discharged amount, the SOC (State of Charge), or the like is used as the load of the battery 20, and the deterioration amounts corresponding to the respective loads are integrated, and the deterioration amount of the battery 20 is computed as the deterioration index. Concretely, the fact that, when left for one week at a temperature of 80° C., the resistance increases by 10%, or the like, is determined in advance by experimentation. From the frequency of the temperature, the deterioration amount of X days at 80° C. and the deterioration amount of Y days at 50° C. are integrated, and the deterioration amounts at other loads also are integrated, and a deterioration index is determined. Then, by using the determined deterioration index, as shown in FIG. 5, the deterioration probability is computed by using a data map or a formula or the like that expresses the relationship between the deterioration index and the deterioration probability.

Further, the deterioration mechanism model, for each mode, formulates the deterioration amount based on the mechanism, and computes the deterioration amount, which is the sum of the respective deterioration modes, as the deterioration index, and computes the deterioration probability by using the computed deterioration index. For example, as shown in FIG. 4, the deterioration index is determined by computing and adding the respective deterioration amounts that are the positive electrode corrosion amount, the positive electrode softening amount, and the negative electrode sulfation amount. Then, as shown in FIG. 5, by using the determined deterioration index, the deterioration probability is computed by using a data map or a formula or the like that expresses the relationship between the deterioration index and the deterioration probability.

Figure 6:
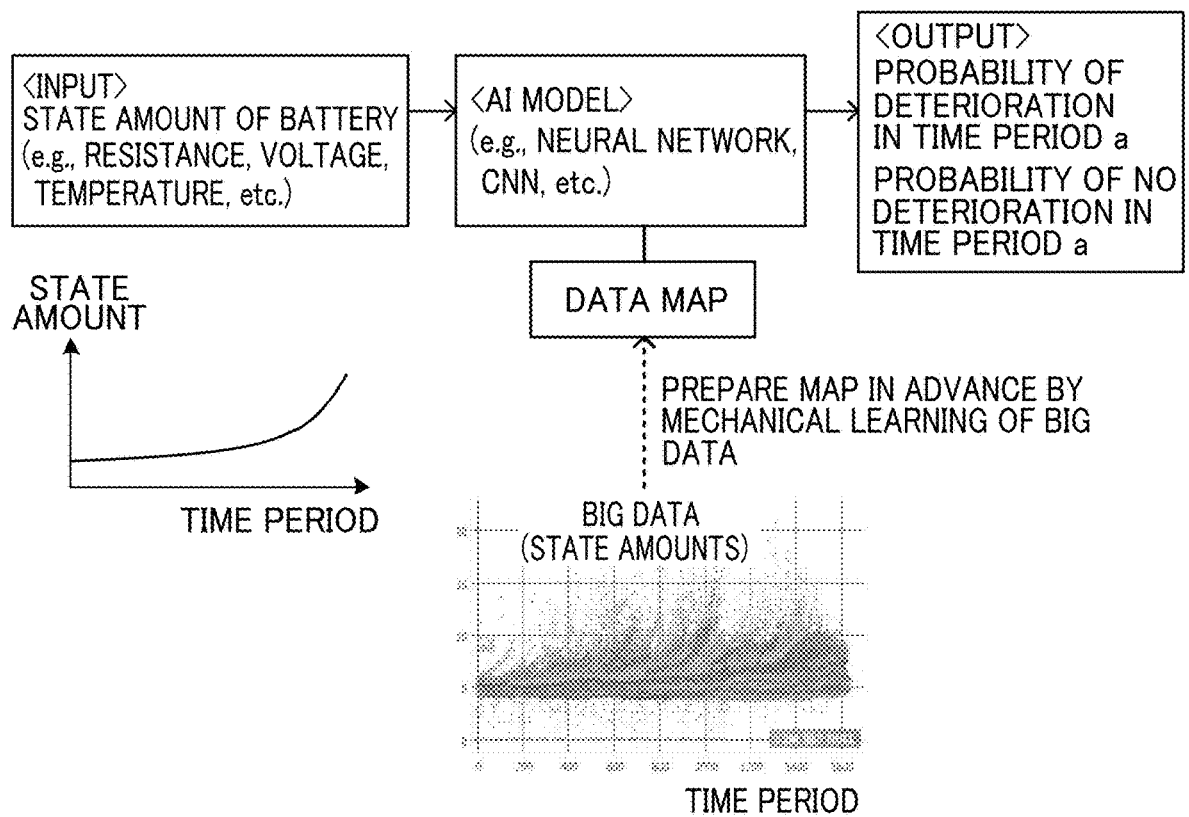
FIG. 6 is a drawing showing an example of computing the deterioration probability by a probability computing section.

As shown in FIG. 6, the probability computing section 42 prepares in advance a data map by mechanical learning in accordance with an AI model such as a neural network or a CNN (Convolutional Neural Network) or the like, by using deterioration data of a state amount that were acquired previously as training data. Then, the probability computing section 42 computes a deterioration probability that serves as the second deterioration probability of the battery 20, by using the prepared data map and by using the state amount of the battery 20 as the input. For example, the probability of deteriorating during time period a that is determined in advance, or the probability of not deteriorating during time period a, is computed as the deterioration probability.

The deterioration judging section 44 judges whether or not the battery 20 has deteriorated by judging whether or not the state amount satisfies a predetermined deterioration condition, based on the results of computation that serve as the results of deriving of the deterioration index computing section 41, and the results of judgement that serve as the results of deriving of the reliability judging section 36, and the results of deriving of the probability computing section 42. For example, deterioration of the battery 20 is judged by judging whether or not the computed deterioration probability is greater than or equal to a predetermined threshold value.

The data outputting section 46 transmits the results of judgment of the deterioration judging section 44 to the on-board device 16 of the vehicle 14 from which the state amount was acquired. Due thereto, notification of the results of judging deterioration of the battery 20 can be given from the on-board device 16.

Note that the battery information acquiring section 22 or the data receiving section 30 corresponds to the acquiring section. The deterioration index computing section 41 corresponds to the first deriving section. The reliability judging section 36 corresponds to the reliability degree deriving section. Further, the probability computing section 42 corresponds to the second deriving section, and the deterioration judging section 44 corresponds to the judging section.

Concrete processings, which are carried out at the center 12 of the battery deterioration judging system 10 relating to the present embodiment that is structured as described above, are described next.

Figure 7:
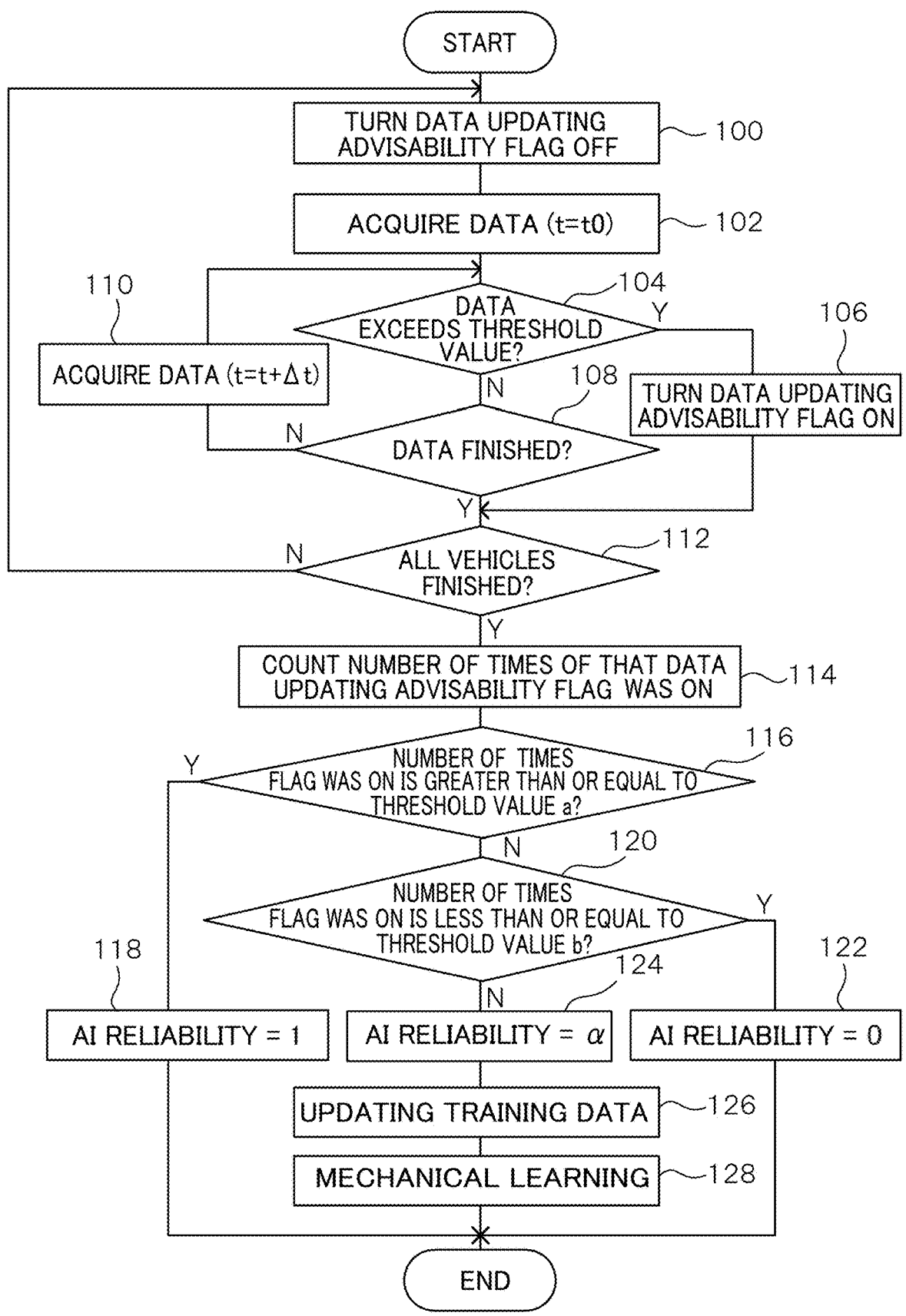
FIG. 7 is a flowchart showing an example of the flow of processings that are carried out by an AI reliability judging section of the center in the battery deterioration judging system relating to the present embodiment.

FIG. 7 is a flowchart showing an example of the flow of processings that are carried out by the AI reliability judging section 32 of the center 12 at the battery deterioration judging system 10 relating to the present embodiment. Note that, for example, the processing of FIG. 7 may start each predetermined time period, or may start each time a predetermined number of state amounts are collected at the center 12. Or, the processing of FIG. 7 may start in a case in which the center 12 receives a start request.

In step 100, the data updating advisability judging section 34 sets a data updating flag to off, and moves on to step 102.

In step S102, the data updating advisability judging section 34 acquires the data of the state amount that the data receiving section 30 has received, and moves on to step 104. One data (e.g., the data of time t=t0) is acquired among the data of the state amount that are received from the vehicle that is focused upon.

In step 104, the data updating advisability judging section 34 judges whether the acquired data of the state amount exceeds a predetermined threshold value. In this judgement, it is judged whether or not there is the possibility that the battery 20 of the vehicle that is being focused upon has deteriorated. If this judgment is affirmative, the data updating advisability judging section 34 moves on to step 106, and, if this judgment is negative, the data updating advisability judging section 34 moves on to step 108.

In step 106, the data updating advisability judging section 34 sets the data updating advisability flag to on, and moves on to step 112.

On the other hand, in step 108, the data updating advisability judging section 34 judges whether or not the above-described processing is finished for all of the data of the vehicle 14 that is being focused upon. If this judgement is negative, the data updating advisability judging section 34 moves on to step 110. If this judgement is affirmative, the data updating advisability judging section 34 moves on to step 112.

In step 110, the data updating advisability judging section 34 acquires, from among the data of the state amount received from the focused-upon vehicle, the next data (e.g., the data of the next time t=t+Δt), and moves on to step 104.

In step 112, the data updating advisability judging section 34 judges whether or not the above-described processing is finished for all of the vehicles. If this judgment is negative, the data updating advisability judging section 34 returns to step 100 and repeats the above-described processings. If this judgment is affirmative, processing moves on to step 114.

In step 114, the reliability judging section 36 counts the number of times that the data updating advisability flag was turned on, and moves on to step 116.

In step 116, the reliability judging section 36 judges whether or not the number of times that flag was on is greater than or equal to predetermined threshold value a. In this judgment, it is judged whether or not the number of times that the flag was on is greater than or equal to the upper limit value a of the training data that was set as shown in FIG. 3. If this judgment is affirmative, the reliability judging section 36 moves on to step 118. If this judgment is negative, the reliability judging section 36 moves on to step 120.

In step 118, the reliability judging section 36 sets the AI reliability to 1, and ends the series of processings.

On the other hand, in step 120, the reliability judging section 36 judges whether or not the number of times that the flag was on is less than or equal to predetermined threshold value b. In this judgment, it is judged whether or not the number of times the flag was on is less than or equal to the lower limit vale b of the training data that was set as shown in FIG. 3. If this judgment is affirmative, the reliability judging section 36 moves on to step 122, and, if this judgement is negative, the reliability judging section 36 moves on to step 124.

In step 122, the reliability judging section 36 sets the AI reliability to 0, and ends the series of processings.

On the other hand, in step 124, the reliability judging section 36 sets the AI reliability to α, and processing moves on to step 126. Note that the AI reliability α is a value from 0 to 1 as shown in FIG. 3.

In step 126, the mechanical learning section 38 updates the training data, and moves on to step 128. Namely, the mechanical learning section 38 adds, as training data, the deterioration data acquired from the on-board device 16.

In step 128, the mechanical learning section 38 carries out mechanical learning by using the updated training data, and updates the data map, and ends the series of processings.

Figure 8:
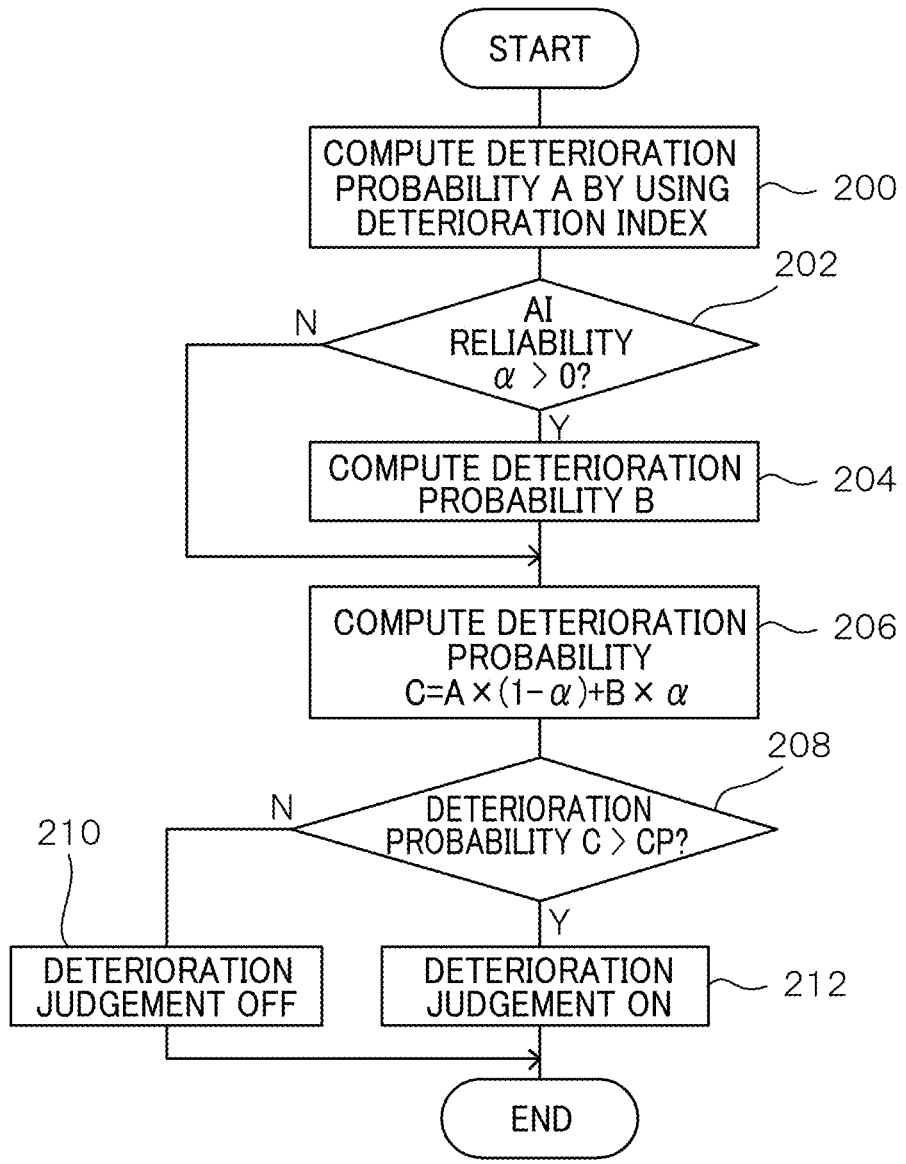
FIG. 8 is a flowchart showing an example of the flow of processings that are carried out by a data computing section of the center in the battery deterioration judging system relating to the present embodiment.

Next, processing that is carried out at the data computing section 40, which is carried out in continuation with the processing of the AI reliability judging section 32, is described. FIG. 8 is a flowchart showing an example of the flow of processings that are carried out at the data computing section 40 of the center 12 at the battery deterioration judging system 10 relating to the present embodiment. Note that the processing of FIG. 8 starts, for example, at the time when the processing of the AI reliability judging section 32 of FIG. 7 ends.

In step 200, the deterioration index computing section 41 computes deterioration probability A by using a predetermined physical model, and processing moves on to step 202. For example, as described above, the deterioration index computing section 41 computes the deterioration probability A by using at least one physical model among the rule model, the battery load integrating model, and the deterioration mechanism model.

In step 202, the probability computing section 42 judges whether or not the AI reliability α is greater than 0. Namely, the probability computing section 42 judges whether or not the AI reliability α is the AI reliability α that was set in step 118 or step 124. If this judgment is affirmative, the probability computing section 42 moves on to step 204, and if this judgment is negative, the probability computing section 42 moves on to step 206.

In step 204, the probability computing section 42 computes the deterioration probability B, and moves on to step 206. Namely, the probability computing section 42 computes the deterioration probability by using the data map that was prepared in advance by mechanical learning by the AI model, and by using the state amount of the battery 20 as the input.

In step 206, the probability computing section 42 computes deterioration probability C, and processing moves on to step 208. The deterioration probability C is computed by $C = A \times (1-\alpha) + B \times \alpha$.

In step 208, the deterioration judging section 44 judges whether or not the computed deterioration probability C is greater than a predetermined threshold value CP. If this judgement is negative, the deterioration judging section 44 moves on to step 210, and if this judgment is affirmative, the deterioration judging section 44 moves on to step 212.

In step 210, the deterioration judging section 44 judges that there is no deterioration of the battery, and turns the deterioration judgment off, and ends the series of processings of the data computing section 40.

On the other hand, in step 212, the deterioration judging section 44 judges that there is deterioration of the battery, and turns the deterioration judgement on, and ends the series of processings of the data computing section 40.

By carrying out processing in this way, in the present embodiment, in the initial stages in which there is little training data, deterioration judgment is carried out by using a physical model that does not require data accumulation. As more training data accumulates, processing can transition to deterioration judgement using an AI model. Due thereto, deterioration of the battery 20 can be judged highly accurately before data is accumulated.

Further, in the deterioration judgment using an AI model, big data relating to deterioration is necessary, and a time period of several years is basically needed for the battery to deteriorate. However, in the present embodiment, deterioration judgment of the battery 20 can be started immediately without waiting for accumulation of data.

In other words, service can be started from an initial stage in which only a small amount of data is obtained. In the latter stages of deterioration, processing can transition to deterioration judgment that uses an AI model that can take dispersion into consideration. Therefore, deterioration can be judged highly accurately.

Note that, in the above-described embodiment, the voltage, resistance, temperature and the like of the battery 20 are given as examples of the state amount, but the state amount is not limited to these. For example, the current or the electric power relating to the battery 20, or the SOC (State Of Charge) or the like that is obtained secondarily, or amounts in which these values are multiplied together or added together, are candidates for the state amount. A single one of the state amounts that are candidates may be used, or a plurality thereof may be used. Which state amount is optimal varies depending on the situation, the accuracy that is required, and the like, and it suffices to select the state amount appropriately.

Figure 9:
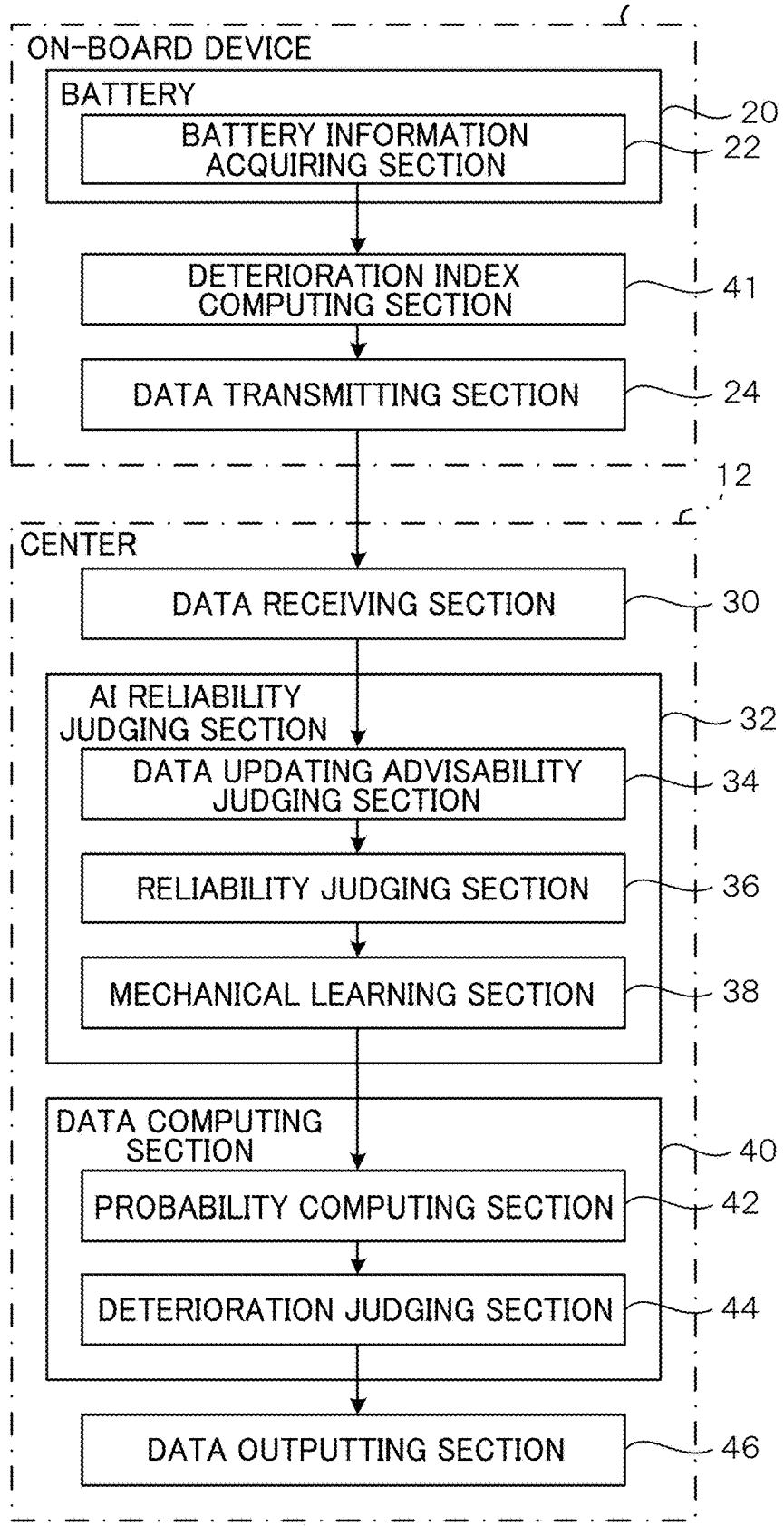
FIG. 9 is a drawing showing functional structures of the deterioration judging system in a case in which the function of a deterioration index computing section is provided at the on-board device.
Figure 10:
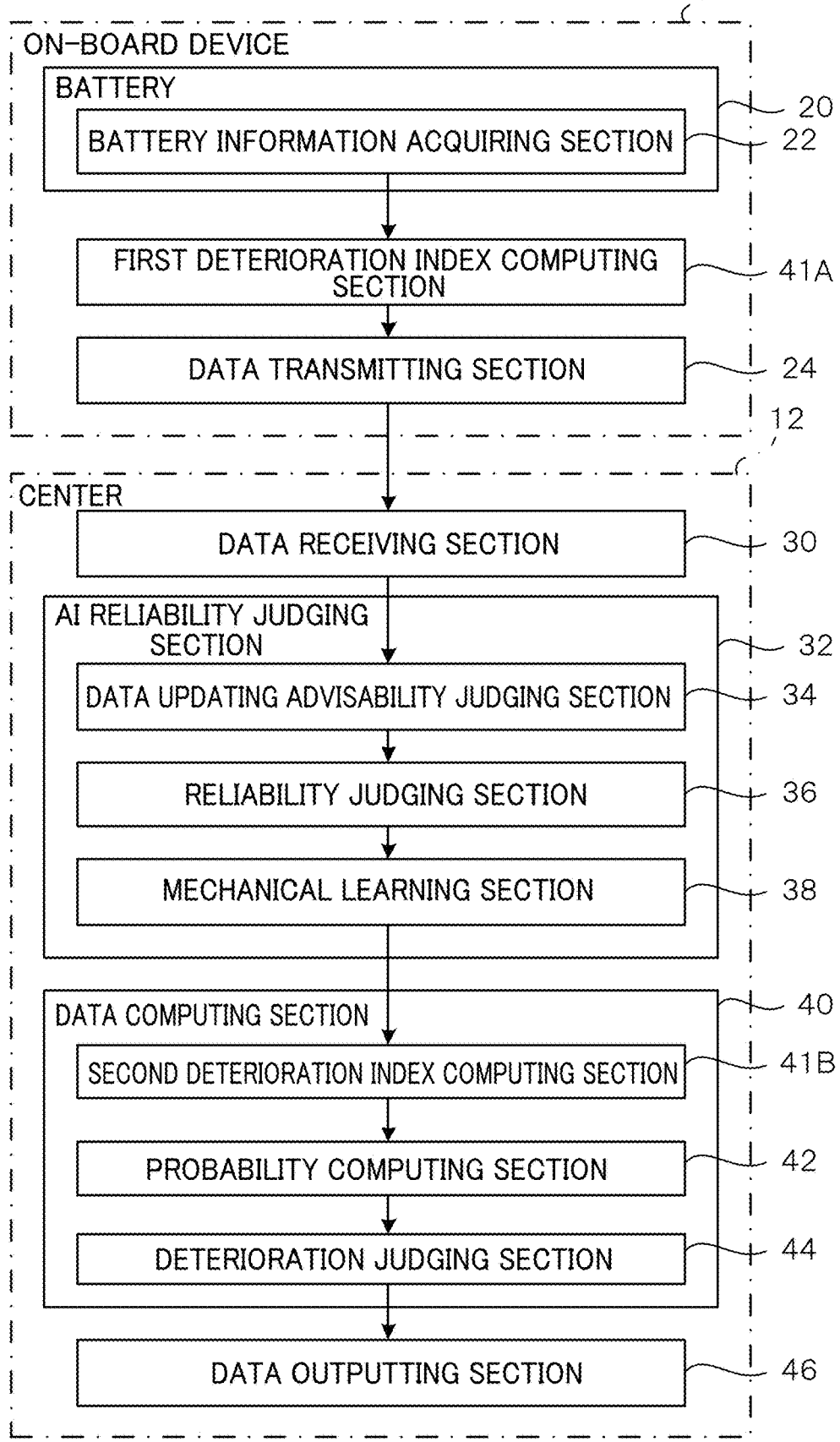
FIG. 10 is a drawing showing functional structures of the deterioration judging system in a case in which the function of the deterioration index computing section is provided at the on-board device and at the center, respectively.

Further, although the above embodiment describes an example in which the function of the deterioration index computing section 41 is provided at the center 12, the present disclosure is not limited to this. For example, as shown in FIG. 9, there may be a form in which the function of the deterioration index computing section 41 is provided at the on-board device 16, and the deterioration probability A is computed at the on-board device by using the state amount, which is acquired by the battery information acquiring section 22, as the input value of the physical model. Or, in a case in which plural types of physical models are used, as shown in FIG. 10, the function of the deterioration index computing section 41 may be provided at the on-board device 16 and the center 12, respectively. In this case, the computing of the deterioration probability A by using a physical amount model whose processing load is relatively low is carried out at a deterioration index computing section 41A that is at the on-board device 16 side, and the computing of the deterioration probability A by using a physical model whose processing load is high is carried out at a deterioration index computing section 41B that is at the center 12 side.

Figure 11:
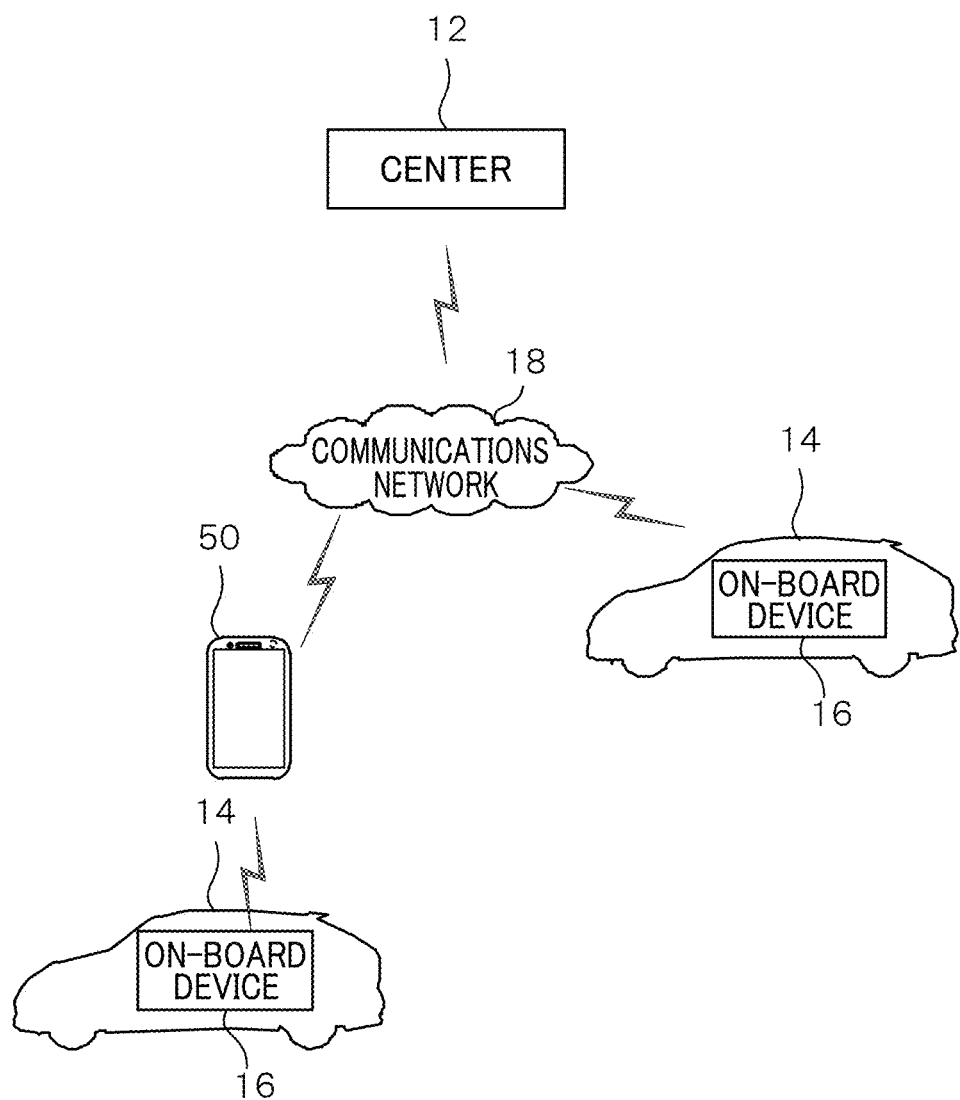
FIG. 11 is a drawing showing the schematic structure of the deterioration judging system in a case in which a portable terminal is used as a communications device.
Figure 12:
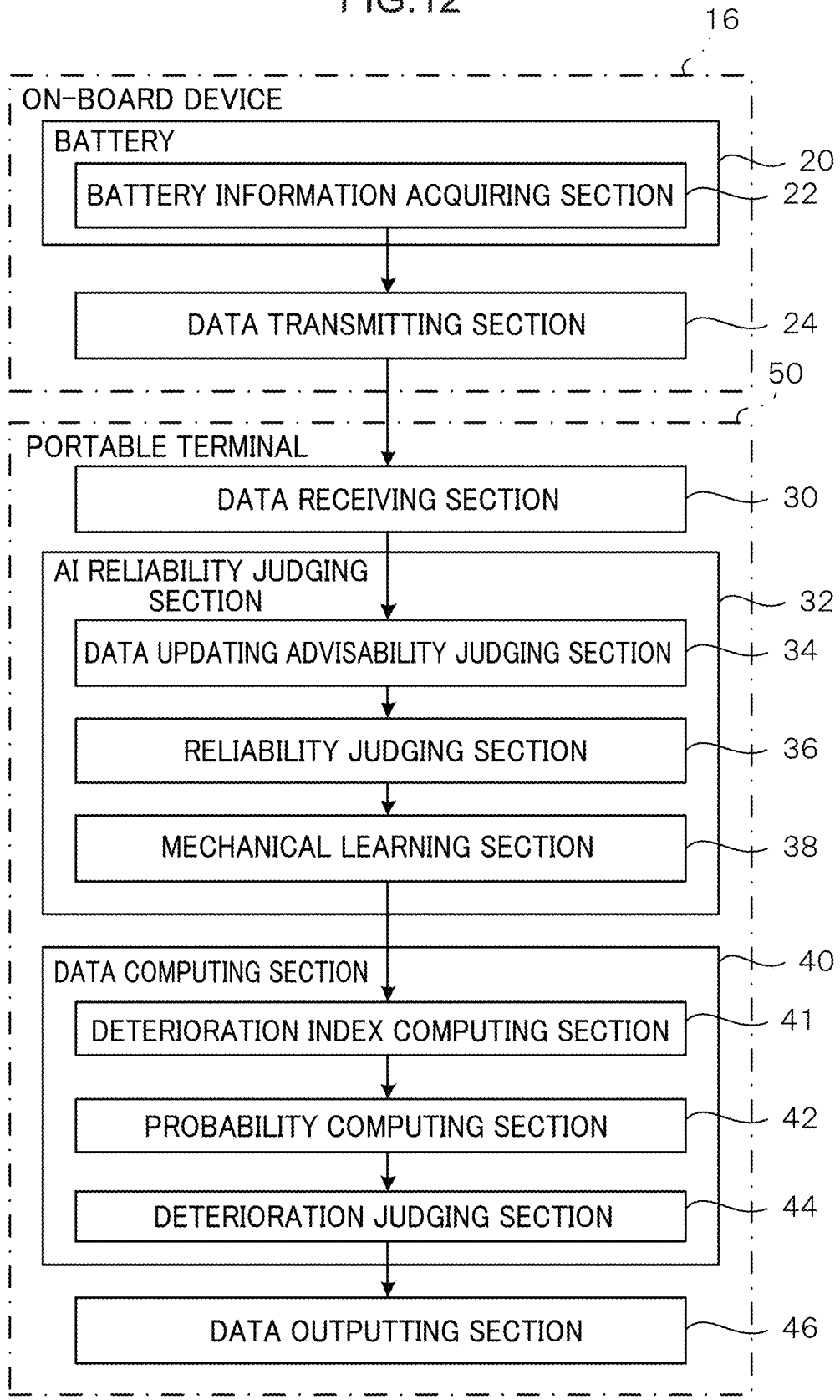
FIG. 12 is a block drawing showing functional structures of the deterioration judging system in a case in which the functions that the center has are provided at the portable terminal.

Further, the above-described embodiment describes an example in which a communications device is provided at the vehicle 14 in order to communicate with the center 12, but the present disclosure is not limited to this. For example, as shown in FIG. 11, a portable terminal 50 such as a smart phone or the like that a vehicle occupant carries may be used as the communications device. Or, as shown in FIG. 12, the functions that the center 12 has and that are shown in FIG. 2 may be provided at the portable terminal 50, and processing that judges the deterioration of the battery 20 may be carried out by the portable terminal 50. In this case, as shown in FIG. 13, the portable terminal 50 has hardware structures that are equivalent to the hardware structures of the center 12.

Further, although the above-described embodiment describes an example in which the deterioration of the battery 20 is judged by using mechanical learning in accordance with big data and an AI model, the present disclosure is not limited to this. Other than these, a deterioration judging method that uses, for example, simple regression analysis or multiple regression analysis or the like may be employed. Or, a deterioration judging method that uses a small amount of data and a physical model may be used. Or, a deterioration judging method that uses both another type of mechanical learning and a physical model may be used.

The above-described embodiment describes an example in which, in the initial state in which the number of training data is less than or equal to the lower limit value b, the deterioration probability is computed without using the deterioration probability B that uses an AI data map. However, the present disclosure is not limited to this. For example, in the initial state in which the number of training data is less than or equal to the lower limit value b, the deterioration probability B may be computed by using a data map of an AI model of another vehicle such as another type of vehicle or the like, and the deterioration judging section 44 may judge the deterioration of the battery 20 by using the deterioration probability B.

Further, the above-described embodiment describes an example in which, at the time of computing the AI reliability α, the reliability is computed by using only the number of deterioration data (the number of training data). However, the present disclosure is not limited to this. For example, the reliability may be computed by using plural indices other than the number of deterioration data. Parameters that affect deterioration (e.g., the travelled distance, the number of years that have elapsed, the charged/discharged amount, and the like) may be used as the indices that are used. The AI reliability α in this case is computed by α=deterioration judgement 1 (the number of deterioration data)+deterioration judgment 2 (the traveled distance)+deterioration judgment 3 (the number of years that have elapsed)+deterioration judgment 4 (the charged/discharged amount). Here, the deterioration judgments 1 through 4 are values from 0 to 0.25.

Further, although one of each of the AI model and the physical model are used in the above-described embodiment, the present disclosure is not limited to this. For example, plural AI models and plural physical models may be combined. The calculation of the AI models and the physical models may be implemented at the center 12 side, or may be implemented at the on-board device 16 side.

Description has been given of a case in which the processings that are carried out at the center 12 in the above-described respective embodiments are software processings that are carried out by executing programs. However, the present disclosure is not limited to this. For example, these processings may be processings that are carried out by hardware such as a GPU (Graphics Processing Unit), an ASIC (Application Specific Integrated Circuit), an FPGA (Field-Programmable Gate Array), or the like. Or, these processing may be processings that combine both software and hardware. Further, in the case of processings by software, programs may be stored on any of various types of non-transitory storage media and distributed.

Moreover, the present disclosure is not limited to the above, and, other than the above, can of course be implemented by being modified in various ways within a scope that does not depart from the gist thereof.

What is claimed is:

1. A battery deterioration judging system comprising a memory and a processor coupled to the memory, the processor being configured to:
   acquire state information indicating a physical parameter of a battery that changes as the battery deteriorates;
   derive a first deterioration probability of the battery, based on the state information of the battery and a first calculation model;
   derive a second deterioration probability of the battery, based on the state information of the battery and a second calculation model, the second calculation model being different from the first calculation model; and
   select at least one of the first deterioration probability and the second deterioration probability based on a reliability of the second calculation model.

2. The battery deterioration judging system of claim 1, wherein the reliability of the second calculation model is derived based on a number of the state information.

3. The battery deterioration judging system of claim 2, wherein the processor is configured to, in a case in which the number of the state information is greater than or equal to a predetermined upper limit value, set the reliability of the second calculation model to 1, in a case in which the number of the state information is less than or equal to a predetermined lower limit value, set the reliability of the second calculation model to 0, and in a case in which the number of the state information is between the upper limit value and the lower limit value, set the reliability of the second calculation model to a value that is between 0 and 1 and is determined in advance in accordance with the number of the state information.

4. The battery deterioration judging system of claim 3, wherein the processor is further configured to judge deterioration of the battery based on the reliability, and the at least one of the first deterioration probability and the second deterioration probability.

5. The battery deterioration judging system of claim 4, wherein the processor is configured to, in a case in which the reliability is 1, judge deterioration of the battery based on the second deterioration probability.

6. The battery deterioration judging system of claim 4, wherein the processor is configured to, in a case in which the reliability is 0, judge deterioration of the battery based on the first deterioration probability.

7. The battery deterioration judging system of claim 4, wherein the processor is configured to, in a case in which the reliability is the value between 0 and 1, judge deterioration of the battery based on the first deterioration probability and the second deterioration probability.

8. A battery deterioration judging method performed by a processor, the method comprising:
acquiring state information indicating a physical parameter of a battery that changes as the battery deteriorates;
deriving a first deterioration probability of the battery, based on the state information of the battery and a first calculation model;
deriving a second deterioration probability of the battery, based on the state information of the battery and a second calculation model, the second calculation model being different from the first calculation model; and
selecting at least one of the first deterioration probability and the second deterioration probability based on a reliability of the second calculation model.

9. The battery deterioration judging method of claim 8, wherein the reliability of the second calculation model is derived based on a number of the state information.

10. The battery deterioration judging method of claim 9, wherein, in a case in which the number of the state information is greater than or equal to a predetermined upper limit value, the reliability of the second calculation model is set to 1, in a case in which the number of the state information is less than or equal to a predetermined lower limit value, the reliability of the second calculation model is set to 0, and in a case in which the number of the state information is between the upper limit value and the lower limit value, the reliability of the second calculation model is set to a value that is between 0 and 1 and is determined in advance in accordance with the number of the state information.

11. The battery deterioration judging method of claim 10, further comprising judging deterioration of the battery based on the reliability, and the at least one of the first deterioration probability and the second deterioration probability.

12. The battery deterioration judging method of claim 11, wherein, in a case in which the reliability is 1, deterioration of the battery is judged based on the second deterioration probability.

13. The battery deterioration judging method of claim 11, wherein, in a case in which the reliability is 0, deterioration of the battery is judged based on the first deterioration probability.

14. The battery deterioration judging method of claim 11, wherein, in a case in which the reliability is the value between 0 and 1, deterioration of the battery is judged based on the first deterioration probability and the second deterioration probability.

15. A non-transitory computer-readable storage medium storing a program executable by a processor to perform battery deterioration judging processing comprising:
acquiring state information indicating a physical parameter of a battery that changes as the battery deteriorates;
deriving a first deterioration probability of the battery, based on the state information of the battery and a first calculation model;
deriving a second deterioration probability of the battery, based on the state information of the battery and a second calculation model, the second calculation model being different from the first calculation model; and
selecting at least one of the first deterioration probability and the second deterioration probability based on a reliability of the second calculation model.

16. The non-transitory computer-readable storage medium of claim 15, wherein the reliability of the second calculation model is derived based on a number of the state information.

17. The non-transitory computer-readable storage medium of claim 16, wherein, in a case in which the number of the state information is greater than or equal to a predetermined upper limit value, the reliability of the second calculation model is set to 1, in a case in which the number of the state information is less than or equal to a predetermined lower limit value, the reliability of the second calculation model is set to 0, and in a case in which the number of the state information is between the upper limit value and the lower limit value, the reliability of the second calculation model is set to a value that is between 0 and 1 and is determined in advance in accordance with the number of the state information.

18. The non-transitory computer-readable storage medium of claim 17, further comprising judging deterioration of the battery based on the reliability, and the at least one of the first deterioration probability and the second deterioration probability.

19. The non-transitory computer-readable storage medium of claim 18, wherein
in a case in which the reliability is 1, deterioration of the battery is judged based on the second deterioration probability,
in a case in which the reliability is 0, deterioration of the battery is judged based on the first deterioration probability, and
in a case in which the reliability is the value between 0 and 1, deterioration of the battery is judged based on the first deterioration probability and the second deterioration probability.

* * * * *